United States Patent [19]
Udagawa

[11] Patent Number: 6,147,363
[45] Date of Patent: Nov. 14, 2000

[54] NITRIDE SEMICONDUCTOR LIGHT-EMITTING DEVICE AND MANUFACTURING METHOD OF THE SAME

[75] Inventor: Takashi Udagawa, Chichibu, Japan

[73] Assignee: Showa Denko K.K., Tokyo, Japan

[21] Appl. No.: 09/217,629

[22] Filed: Dec. 22, 1998

Related U.S. Application Data

[60] Provisional application No. 60/100,573, Sep. 16, 1998.

[30] Foreign Application Priority Data

Dec. 25, 1997 [JP] Japan ................................. 9-356997

[51] Int. Cl.[7] .................................................. H01L 29/04
[52] U.S. Cl. ............................... 257/64; 257/76; 257/103
[58] Field of Search ............................... 257/64, 76, 103; 438/46, 47

[56] References Cited

U.S. PATENT DOCUMENTS

| | | | |
|---|---|---|---|
| 4,224,632 | 9/1980 | Iwamoto et al. | 357/17 |
| 5,693,963 | 12/1997 | Fujimoto et al. | 257/94 |
| 5,886,367 | 3/1999 | Udagawa | 257/64 |

FOREIGN PATENT DOCUMENTS

| | | |
|---|---|---|
| 599 224 | 6/1994 | European Pat. Off. . |
| 195 11 415 | 10/1995 | Germany . |
| 196 29 720 | 2/1997 | Germany . |
| 197 34 034 | 2/1998 | Germany . |
| 55-3834 | 1/1980 | Japan ............................. H01L 33/00 |
| 9-36430 | 2/1997 | Japan ............................. H01L 33/00 |
| 9-40490 | 2/1997 | Japan ............................. C30B 25/14 |
| 10-56202 | 2/1998 | Japan ............................. H01L 33/00 |
| 10-107315 | 4/1998 | Japan ............................. H01L 33/00 |

OTHER PUBLICATIONS

"InGaN/AlGaN Blue–Light–Emitting Diodes" by S. Nakamura, J. Vac. Sci. Technol. A 13(3), May/Jun. 1995, American Vacuum Society.

"Superbright Green InGaN Single–Quantum–Well–Structure Light–Emitting Diodes" by S. Nakamura, Jpn. J. Appln. Phys. vol. 34 (1995) pp. 1332–1335.

*Primary Examiner*—Olik Chaudhuri
*Assistant Examiner*—Douglas A. Wille
*Attorney, Agent, or Firm*—Sughrue, Mion, Zinn, Macpeak & Seas, PLLC

[57] ABSTRACT

A nitride semiconductor light emitting device which uses as a light emitting layer an indium-containing group-III nitride semiconductor layer of a multi-phase structure composed of a main phase and sub-phases having different indium contents is characterized in that the sub-phases are mainly formed of crystal whose boundary with the main phase is surrounded by a strained layer.

12 Claims, 3 Drawing Sheets

NITRIDE SEMICONDUCTOR LIGHT-EMITTING DEVICE AND MANUFACTURING METHOD OF THE SAME

CROSS REFERENCE TO RELATED APPLICATIONS

This application is an application filed under 35 U.S.C. §111(a) claiming benefit pursuant to 35 U.S.C. §119(e)(1) of the filing date of the Provisional Application No. 60/100,573, filed Sep. 16, 1998, pursuant to 35 U.S.C. §111(b).

BACKGROUND OF THE INVENTION

1. Field of the Invention

The present invention relates to a nitride semiconductor light-emitting device which uses as a light emitting layer an indium-containing group-III nitride semiconductor layer of a multi-phase structure composed of a main phase and sub-phases which have different indium contents, and a method of fabricating the same.

2. Description of the Prior Art

An indium-containing group-III nitride semiconductor expressed by the general formula $Al_xGa_yIn_zN_aM_{1-a}$ (x+y+z=1, $0\leq x$, y<1, $0<z\leq 1$, $0<a\leq 1$, M: group-V element other than nitrogen) is used as a light emitting layer for nitride semiconductor light-emitting devices which radiate a short wavelength light. Particularly, a gallium indium nitride mixed crystal ($Ga_bIn_{1-b}N$: $0\leq b<1$) is a typical component material of the light emitting layer (see Japanese Patent Publication No. 55-3834). To mention one background art, a gallium indium nitride mixed crystal ($Ga_{0.80}In_{0.20}N$) having an indium content of 20% has been used as a light emitting layer of a blue light emitting diode (LED) emitting light of a wavelength of about 450 nm. A gallium indium nitride mixed crystal having an indium content of 45% has been used as a light emitting layer of a green light emitting diode (LED) emitting a light of a wavelength of about 525 nm.

The gallium indium nitride mixed crystal is also used as a well layer of a single or multi-quantum well structure which serves as a light emitting part thereof (see Japanese Patent Public Disclosure No. 9-36430). It has been considered desirable for the gallium indium nitride mixed crystal heretofore widely used as a light emitting layer to be homogeneous regarding In content (see Japanese Patent Public Disclosure No. 9-36430). However, it was recently found that a gallium indium nitride layer which is inhomogeneous regarding the In content is advantageous as a light emitting layer (see Japanese Patent Public Disclosure No. 10-107315). This so-called multi-phase structure gallium indium nitride is a layer formed of an aggregation of phases having different In content.

The high-intensity light emission from the gallium indium nitride layer of the multi-phase structure having unevenness of the In content and exhibiting "variance" of the In content as described above has been concluded to be attributable to quantized light emitters such as quantum dots. A gallium indium nitride layer of the multi-phase structure is generally composed of a main phase (matrix phase) and sub-phases, the main phase accounting for the major portion thereof in terms of volume (see Japanese Patent Public Disclosure No. 10-56202). The sub-phases are usually different from the main phase in In content. Even among the sub-phases, the In content always differs. The sub-phases take the form of approximately spherical or island-shaped microcrystals, which are scattered in the main phase.

In the background art, a participation of a quantized level, which is formed at a boundary between the microcrystal (sub-phases) and the main phase surrounding it, in a light emission is indicated (see Japanese Patent Public Disclosure No. 10-107315). The size of the microcrystal is several nm to several tens of nm in diameter, and the microcrystal is large enough to act as a quantum dot. It is considered that these sub-phases act as a quantum dots taking part in light emission from a light emitting layer composed of an indium-containing group-III nitride semiconductor.

Although the sub-phases (quantum dots) participate in the light emission from the light emitting layer formed of the indium-containing group-III nitride semiconductor, no technology is available for obtaining stable emission characteristics, i.e., stable emission intensity and emission wavelength, of the light emission from the light emitting layer. The emission characteristics obtained are therefore unstable.

The principal reason why stable emission characteristics have not been obtained in the background art is that the requirements for operating the sub-phases as quantized light emitter are not well known. The requirements for effectively operating the microcrystals, i.e., the sub-phases, as quantum dots must be clarified in order to obtain stable emission characteristics, especially at high emission intensity.

The present invention was made in view of the above described circumstances, and has as an object to provide a nitride semiconductor light-emitting device which is capable of providing stable and excellent emission characteristics of light from a light emitting layer, by elucidating the requirements for effectively operating the sub-phases as quantum dots, and a manufacturing method of the same.

SUMMARY OF THE INVENTION

To achieve the foregoing object, the present invention defines the structure of a region near the boundary between each sub-phase and the main phase surrounding the sub-phases, in order to allow the microcrystals constituting the sub-phases to act as quantized light emitters. Specifically, a nitride semiconductor light-emitting device of the present invention having an indium-containing group-III nitride semiconductor layer as its light emitting layer, which has a multi-phase structure composed of a main phase and sub-phases having different indium contents, is characterized in that the sub-phases are principally formed of crystals whose boundaries with the main phase are surrounded by strained layers.

In the method of fabricating a nitride semiconductor light-emitting device of the present invention having an indium-containing group-III nitride semiconductor layer as its light emitting layer, which has a multi-phase structure composed of a main phase and sub-phases having different indium contents, after the light-emitting layer is subjected to a heat treatment in a range between 950° C. and 1200° C., the light-emitting layer is cooled from the heat treatment temperature to 950° C. at a rate of 20° C. per minute or more, and is cooled from 950° C. to 650° C. at a rate of 20° C. per minute or less, thus forming strained layers at the boundaries between the sub-phases and the main phase constituting the light-emitting layer.

As described above, in the present invention, since each sub-phase is mainly composed of a crystal having a strained layer at a boundary with the main phase around it, the strained layer present around the sub-phase stably generates carriers which increase the emission intensity. Therefore, the crystal constituting the sub-phases is enabled to effectively act as a quantized emission medium, so that a short wavelength visible light emitted from the nitride semiconductor light-emitting device including this light emitting layer can be made to exhibit a high emission intensity and excellent monochromaticity.

These and other objects and features of the present invention will be more fully apparent from the following detailed description taken in conjunction with the accompanying drawings.

DETAILED DESCRIPTION OF THE PREFERRED EMBODIMENTS

Figure 1:
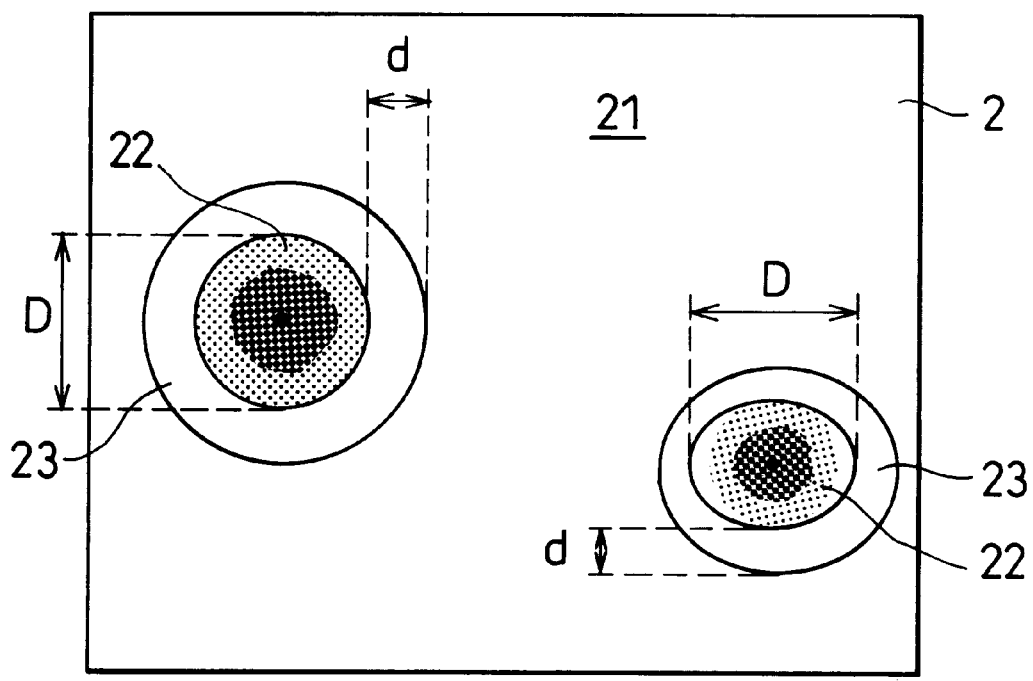
FIG. 1 is a diagram representing an example of a crystal lattice image obtained by photographing a light emitting layer of a nitride semiconductor light-emitting device of the present invention with a transmission electron microscope (TEM).

Embodiments of the present invention will be described below in detail.

A crystal phase occupying a certain region spatially, which has approximately a constant In content (concentration), is simply expressed as a phase in the following explanation. A phase occupying a large region spatially is called a main phase, and a phase occupying a small spatial occupation region compared with the main phase is called a sub-phase. Sub-phases can be distributed almost homogeneously in the main phase or be unevenly located at regions near the junction interface with other layers. The main phase and the sub-phases are not discriminated by In content, but by the volume they occupy in the space.

The main phase is formed mostly of a layer-structure single crystal obtained by stacking single crystal layers. In some cases, the main phase locally contains polycrystalline regions or amorphous regions. Regardless of crystal form, it is the main phase that occupies a large area. Almost all of the sub-phases are small crystals (microcrystals). The microcrystals are made from single crystal or polycrystal, or are amorphous. Alternatively, the microcrystal is a mixture of these substances. Generally, the shape of the microcrystal is approximately spherical or polygonal island-like. The diameter of the sub-phases is about several nm to several tens of nm, or the width thereof is about several nm to several tens of nm in the case where it is island-shaped. Though a comparatively large In deposit of several $\mu$m to several tens of $\mu$m sometimes occurs from a nucleus of indium deposited at the junction interface with other layers, in the present invention a crystal having a size of about several nm to several tens of nm is dealt with as a sub-phase.

In the present invention, the light emitting layer is formed of an indium-containing group-III nitride semiconductor having a multi-phase structure composed of the main phase and the sub-phases. The average layer thickness of the layer-like substance constituting the main phase is the layer thickness of the light emitting layer. When the light emitting layer has an extremely thin thickness of less than about 1 nm, it lacks continuity as a layer. The light emitting layer formed of the discontinuous layer disadvantageously reduces the forward voltage of the light-emitting device. On the contrary, when the light emitting layer is a thick layer having a thickness above about 300 nm, it has degraded surface morphology and can not be advantageously used as a light emitting layer contributing to an increase in emission intensity. Therefore, the layer thickness of the light emitting layer should be in the range of about 1 to 300 nm.

The light emitting layer can be formed of an indium-containing group-III nitride semiconductor intentionally doped with impurities. The light emitting layer can be also formed of an indium-containing group-III nitride semiconductor not intentionally doped with impurities. Furthermore, the light emitting layer can be also formed of a stacked structure of undoped and doped layers. From the viewpoint of the emission intensity, the doped light emitting layer should be made somewhat thicker. The thickness thereof should be about 10 to 300 nm. The undoped light emitting layer should be made thinner. The thickness of the undoped light emitting layer should be in the range of about 1 to 10 nm.

The conductivity type of the light emitting layer should be n-type. This is because the transition of carriers, especially electrons, between the main phase and the sub-phases, principally determines the emission intensity. Therefore, it is most preferable for the light emitting layer to use electrons as majority carriers, that is, for the light emitting layer to be n-type. It is advantageous for the carrier concentration of the light emitting layer to be set to not less than about $1 \times 10^{16}$ cm$^{-3}$ and not larger than $1 \times 10^{19}$ cm$^{-3}$. It is not absolutely necessary for the carrier concentrations of the main phase and the sub-phases to be set approximately the same. For example, the carrier concentration of the main phase can be about $1 \times 10^{18}$ cm$^{-3}$ and the carrier concentration of the sub-phases about $10^{17}$ cm$^{-3}$. Whatever the difference between the carrier concentrations of the main phase and the sub-phases, the carrier concentration should be set to be within the foregoing range throughout the light emitting layer.

The sub-phases are generated from the inside of the main phase. For example, the sub-phases originate from indium as nuclei contained inside the main phase, which segregate at a strained region or a crowded region of crystal defects within the main phase. When the density of the sub-phases within the main phase becomes extremely large, a light emitted from the main phase (light emitting layer) lacks monochromaticity. When the density of the sub-phases exceeds $2 \times 10^{18}$ cm$^{-3}$, monochromaticity of the emitted light sharply deteriorated. Therefore, the density of the sub-phases should be set to $2 \times 10^{18}$ cm$^{-3}$ or less. Particularly, in the undoped light emitting layer having a layer thickness of 20 nm or less, it is advantageous that the density of the sub-phases be set to $5.0 \times 10^{23}$ xt (t: layer thickness (cm)) or less. If the density of the sub-phases is set within the foregoing range, emitted light having a half width of 15 nm or less, which is excellent in monochromaticity, can be obtained.

In some cases, a light emitting layer formed of an indium-containing group-III nitride semiconductor which is vapor-grown by the MOCVD growth method at a temperature in the range from not less than 650° C. to less than 950° C. separates into many phases in the as-grown state. However, in the multi-phase in the as-grown state, the sizes of the sub-phases are extremely inhomogeneous. When the as-grown indium-containing group-III nitride semiconductor layer is heat treated, the sub-phases can be stably generated while making the main phase serve as a parent phase, and the multi-phase structure can be produced. In a heat treatment method which stably forms an indium-containing group-III nitride semiconductor of a multi-phase serving as the light emitting layer, the sizes of the sub-phases can be uniformized by optimizing (a) the temperature elevation rate from the growth temperature of the light emitting layer to the heat treatment temperature, (b) the holding time in the heat treatment temperature, and (c) the cooling rate when the temperature is lowered from the heat treatment temperature. The uniformization of the sizes of the sub-phases as well as a homogeneous formation of the In content (composition) in the sub-phases especially exerts the effect of increasing homogeneity of the emission wavelength and monochromaticity of the emitted light.

In the present invention, the structure of the boundary region between the main phase and the sub-phases in the light emitting layer is additionally defined. Specifically, the feature of the sub-phases of the present invention is that the sub-phases hold the strained regions (strained layers) at the boundaries between the sub-phases and the main phase surrounding them. And, the number of the sub-phases having this strained layer is set to account for 50% or more of the total number of sub-phases.

In the heat treatment of the light emitting layer for stably forming the multi-phase structure, the sub-phases having the peripheral strained layers can be formed by suitably adjusting the cooling rate from the heat treatment temperature. The most preferable cooling method is to lower the temperature from the heat treatment temperature between 950° C. and 1200° C. while changing the lowering rate. The preferred heat treatment temperature range is between 950° C. and 1200° C. Particularly, the cooling method comprising the steps of lowering the temperature from the heat treatment temperature to 950° C. at the rate of 20° C. per minute or more and from 950° C., to 650° C. at the rate of 20° C. per minute or less enables stable formation of the sub-phases holding the strained layers at their peripheries. By this cooling method, the percentage of the sub-phases having the strained layer can reliably be made 50% or more of the total number of sub-phases. The percentage of the sub-phases having the strained layer can be determined by counting the number of sub-phases having the strained layer in a lattice image photographed with a transmission electron microscope (TEM). When the temperature is lowered from the heat treatment temperature to 950° C. at the rate of 20° C., per minute or less, good surface morphology of the light emitting layer can not be maintained, resulting in the light emitting layer lacking flatness. Rapid cooling conducted at a rate exceeding 20° C. per minute from 950° C. to 650° C. is disadvantageous because it produces more than the proper number of strained layers at the peripheries of the sub-phases.

It is unnecessary to independently conduct the aforementioned heat treatment for forming the multi-phase structure. The formation of the multi-phase structure can be achieved by the growth operation conducted when, for example, a gallium nitride layer or an aluminium gallium nitride layer is grown on the light emitting layer formed of the indium-containing group-III nitride semiconductor layer. This is because the growth temperature when these layers are grown on the light emitting layer is within the range of the foregoing preferable heat treatment temperatures.

It can be confirmed by an ordinary cross-sectional TEM technique using a transmission electron microscope (TEM) whether the indium-containing group-III nitride semiconductor assumes the multi-phase structure. On the bright-field cross-sectional TEM image of a gallium indium nitride mixed crystal formed of the multi-phase structure, the sub-phase portions are photographed in black contrast of approximately spherical or trapezoidal or polygonal shape. In some cases, a black contrast originates from a crystal defect such as a dislocation. The contrast attributable to the dislocation is generally line-shaped. It is possible to know from the shape of the contrast whether it is a sub-phase or not, and it is possible to know the shape of the sub-phases therefrom. The density of the sub-phases in the main phase can be measured from the density of the contrasts attributed to the sub-phases. With an analytical electron microscope equipped with a composition analyzer, such as an electron probe microanalyzer (EPMA), the In content of each of the main phase and the sub-phases can be analyzed. The difference (variance) of the In content between the main phase and the sub-phases can be analyzed also by a precise X-ray diffraction method known as the four-crystal method.

Presence of the strained layer at the periphery of the sub-phases can be observed from the cross-sectional TEM image at a high magnification. The observation is best conducted at a high magnification of several millions.

FIG. 1 is a diagram representing an example of a crystal lattice image of the light emitting layer when the light emitting layer of the nitride semiconductor light-emitting device of the present invention is photographed using a transmission electron microscope (TEM). This crystal lattice image is obtained by photographing with a bright field section TEM technique at a magnification of $2 \times 10^6$. Explanation will be continued with reference to this figure.

The light emitting layer 2 has a multi-phase structure composed of a main phase 21 and sub-phases 22 which differ from the main phase 21 in indium (In) content. A strained layer 23 exists at the periphery of each sub-phase 22 in the main phase 21 serving as the matrix of the light emitting layer 2. Specifically, the sub-phase 22 is a crystal having the strained layer 23 formed at the boundary with the main phase 21. Although the thickness d of the strained layers 23 are shown to be generally even around the sub-phases 22, this is not always true. In some cases, the strained layer 23 is distorted and, for example, grows to be thicker only toward one direction.

When the spacing of the crystal lattice planes is compared, it is found that the spacing of the lattices is different in the main phase 21, the sub-phases 22 and the strained layers 23. Specifically, it is found that the strained layer 23 has a lattice plane (lattice image) spacing and a lattice orientation different from those of the main phase 21 and the sub-phase 22. The spacing of the lattice image of the strained layer 23 is intermediate between those of the main phase 21 and the sub-phase 22 and its lattice (image) is sometimes disordered.

The thickness d of the strained layer 23 surrounding the sub-phase 22 has an effect on the intensity of light emitted from the light emitting layer 2 of the multi-phase structure. When the strained layers 23 become too thick, they do not have a large emission intensity increasing effect. There exists a thickness d suitable for the strained layer 23 in order to obtain a high intensity light emission. The thickness (region width) d of the strained layer 23 suitable for high intensity light emission is $0.5 \times D$ or less, where D is the size of the sub-phase 22. When the sub-phase 22 are approximately spherical, the size D can be expressed by a diameter. In the case of island-shaped sub-phases, the size D can be expressed by a width. For example, the thickness of the strained layer 23 for a spherical sub-phase having a diameter of 20 nm is set to 10 (=0.5×20) nm or less.

Although the thickness d of the strained layer 23 is not always approximately homogeneous, the effect is not impaired even if the average thickness d of the strained layer 23 is 0.5×D or less. When the strained layer 23 is extremely thin, however, a large emission intensity increasing effect is not exhibited. The reason is supposed to be that if some strained layer 23 does not exist between the main phase 21 and the sub-phase 22, a band structure for generating quantized carriers contributing to high intensity light emission is not fully created. The thickness of the strained layer 23 should be at least 5 Å, and it should preferably be 10 Å(=1 nm) or more.

On the other hand, the maximum value of the thickness d of the strained layer 23 should be 10 nm or less. This is the preferable thickness of the strained layer decided considering that the In content of the indium-containing group-III nitride semiconductor layer generally used as the light emitting layer 2 is about 5% to about 50%. Therefore, the thickness d of the strained layer 23 should be set in the range of from about 5 Å or more to 10 nm or less.

As pointed out above, the thickness d of the strained layer 23 can be controlled by adjusting the temperature lowering rate in the cooling step of the heat treatment of the light emitting layer 2 for producing the multi-phase structure, after termination of growth of the indium-containing group-III nitride semiconductor layer serving as the light emitting layer 2. The temperature lowering (cooling) rate in the temperature range of 950° C. to 650° C. is a dominant factor determining the thickness d of the strained layers 23. The temperature lowering rate within this temperature range should be 20° C. per minute or less. Good formation of strained layers 23 having a thickness in the range of 5 Å or more to 10 nm or less can be obtained by setting the temperature lowering rate in the range of 5° C./minute to 20° C./minute, more preferably in the range of 7° C./minute to 15° C./minute. At the same time, under such cooling rate, the percentage of the sub-phases having the strained layer can be reliably made to be 50% or more. When the temperature is lowered at a rate exceeding 20° C./minute, the thickness d of the strained layer 23 increases and it is difficult to maintain the thickness d below 0.5×D. On the contrary, when the temperature lowering rate is below 5° C./minute, the thickness d of the strained layer 23 decreases and when it is below 3° C./minute it is impossible to secure even the minimum strained layer thickness of about 5 Å.

As for the temperature lowering rate in the foregoing cooling step, a variety of temperature lowering patterns can be adopted. For example, from 950 to 650° C. the cooling may be conducted at a constant temperature lowering rate, or the cooling may be conducted while changing the temperature lowering rate. For example, good results are obtained when the temperature is lowered from 950 to 800° C. at the rate of 15° C. per minute, followed by lowering the temperature from 800 to 650° C. at the rate of 10° C. per minute. Alternatively, the cooling can be started from 950° C. at a constant rate and the temperature be kept constant for a predetermined waiting time at a certain temperature between 950 and 650° C., followed by cooling to 650° C. The advantage of keeping the temperature approximately constant for the predetermined waiting time at the time of the temperature lowering treatment is that homogeneity of the thickness d of the strained layers 23 at the periphery of the sub-phases 22 can be achieved. Therefore, when the temperature lowering rate defined by the present invention is used jointly with the temperature lowering method in which the waiting time is established, the thickness d of the strained layer can be controlled and homogeneity of the thickness d of the strained layer 23 can be achieved. The presence of the strained layers 23 having the controlled and even thickness contributes to making the quantum level even, resulting in an increase in the emission intensity and monochomaticity of the emitted light.

As described above, in this embodiment, in the light emitting layer formed of the indium-containing group-III nitride semiconductor of the multi-phase structure composed of the main phase and the sub-phases having different indium content, since the sub-phases are mainly formed of crystal having strained layers at the boundary with the surrounding main phase, the strained layers present around the sub-phases stably generate carriers contributing to increase of the emission intensity. Therefore, the crystal constituting the sub-phases is enabled to effectively act as a quantized emission medium, and the short wavelength visible light output from the nitride semiconductor lightemitting device including this light emitting layer is stably emitted at a high emission intensity and with excellent monochromaticity.

Moreover, since the sub-phases are principally constituted of crystal having strained layers of a width of 0.5×D or less relative to the total size (D) of the sub-phase, the thickness of the strained layers can be kept to a value suitable for obtaining high intensity light emission.

Further, since the sub-phases having the strained layer are made to account for 50% or more of the total number of sub-phases, the characteristic of the strained layer that contributes to enhancement of the light emission intensity is reliably exhibited.

Still further, since the density of the sub-phases is set to be $2 \times 10^{18}$ $cm^{-3}$ or less, emitted light having, for example, a half width of 15 nm or less, which is excellent in monochromaticity, can be obtained.

The nitride semiconductor light-emitting device of the present invention will now be described with respect to specific examples. The present invention is not limited to these examples.

First Example

An example in the case where the present invention was applied to a light emitting diode (LED) will be described. Using a MOCVD (Metal Organic Chemical Vapor Deposition) growth reactor of the ordinary normal pressure (atmospheric pressure) type, constituent layers of a stacked layer structure used for the LED were sequentially formed on a substrate according to the following procedures.

Figure 2:
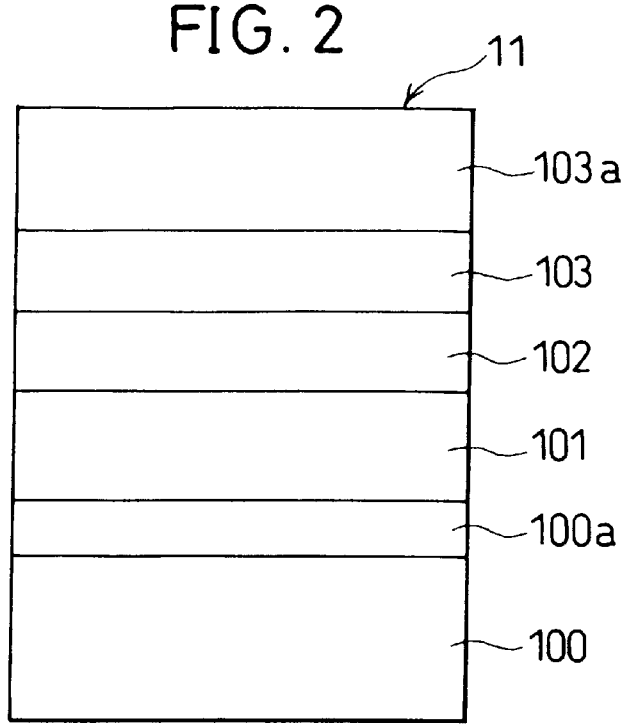
FIG. 2 is a schematic view showing a stacked layer structure of a light-emitting device that is a First Example of the present invention.

FIG. 2 is a schematic view showing the stacked layer structure of the LED according to the First Example. The stacked layer structure 11 was constructed by stacking layers on a substrate 100. As the substrate 100 was used a (0001) (c-surface)-sapphire ($\alpha$-$Al_2O_3$ single crystal) having a diameter of 2 inches (50 mm) and a thickness of about 90 $\mu$m, both surface of which were polished. A low temperature buffer layer 100a of aluminum gallium nitride ($Al_{0.8}Ga_{0.2}N$) film was formed on the substrate 100 by the normal pressure MOCVD method, using source materials of trimethyl gallium (($CH_3$)$_3$Ga), trimethyl aluminum (($CH_3$)$_3$Al) and ammonia ($NH_3$). Film formation was conducted for 3 minutes at a temperature of 430° C. in a hydrogen stream. The hydrogen flow rate was 8 liters per minute, and the ammonia gas flow rate was 1 liter per minute. The thickness of the low temperature buffer layer 100a was 15 nm.

Next, hydrogen gas containing disilane ($Si_2H_6$) at a volume concentration of about 3 ppm was added to a MOCVD reaction system, and an n-type gallium nitride (GaN) layer 101 was formed on the low temperature buffer layer 100a in hydrogen-argon (Ar) stream at a temperature of 1100° C. for 90 minutes. The amount of disilane-hydrogen mixed gas added to the system was precisely controlled by an electronic mass flow controller (MFC) to be 10 cc per minute. The carrier concentration of the n-type gallium nitride layer 101 doped with silicon (Si) was $3\times10^{18}$ $cm^{-3}$ and the thickness was about 3 μm.

After the temperature of the substrate 100 had been lowered from 1100 to 800° C., a light emitting layer 102 composed of gallium indium nitride ($Ga_{0.82}In_{0.18}N$) having an average In content of 18% was deposited on the n-type gallium nitride layer 101. The growth of the light emitting layer 102 was conducted in an argon stream. The thickness of the light emitting layer 102 was made 5 nm. Trimethyl gallium was used as the gallium source and trimethyl indium was used as the indium source. The trimethyl gallium was kept at a constant temperature of 0° C., and the hydrogen flow rate for bubbling it was precisely controlled to 1 cc per minute by the MFC. The trimethyl indium was kept at a constant temperature of 50° C. The flow rate of hydrogen accompanying the sublimated trimethyl indium vapor was set to 13 cc per minute with the help of MFC. The flow rate of ammonia gas, the nitrogen source, was set so that the V/III ratio at the time of growth of the light emitting layer 102 became about $3\times10^4$. Here, the V/III ratio represents the ratio of the concentration of the nitrogen source to the total concentration of the gallium source and the indium source supplied to the growth reaction system. The growth rate of the light emitting layer 102 was lower than that of the n-type gallium nitride layer 101 and was set to about 2 nm/minute.

After completion of the light emitting layer 102, the substrate 100 was rapidly heated from 800 to 1100° C. at a temperature increase rate of 100° C./minute in an argon stream. The composition of the atmosphere of the MOCVD reaction system was changed to a mixture composed of argon and hydrogen during a waiting time of one minute at 1100° C., and an aluminum gallium nitride mixed crystal layer ($Al_{0.15}Ga_{0.85}N$) layer 103 doped with magnesium (Mg) was deposited on the light emitting layer 102. The growth rate was set to about 3 nm/minute, which was 1.5 times faster than the growth rate of the light emitting layer 102. The growth was continued for 10 minutes to obtain a mixed layer of a thickness of about 30 nm. Bis-cyclopentadienylmagnesium (bis-$(C_5H_5)_2Mg$) was used as the doping source of magnesium. The supply amount of the magnesium doping source to the MOCVD reaction system was set to $8\times10^{-6}$ mol/min. The concentration of magnesium atoms in the Mg doped aluminum gallium nitride layer 103 was determined as about $6\times10^{19}$ atoms/$cm^3$ by ordinary SIMS analysis.

Subsequently, a Mg-doped gallium nitride layer 103a was deposited on the Mg-doped aluminum gallium nitride layer 103 for 20 minutes at a temperature of 1100° C. in an argon-hydrogen mixed gas stream. Trimethyl gallium was used as the gallium source, and the same organic Mg compound as used for the growth of the Mg-doped aluminum gallium nitride layer 103 was used as the magnesium source. Since a tendency for the doping efficiency of magnesium to increase with decreasing growth rate was observed, the growth rate was set to about 3 nm/minute. The thickness of the Mg-doped gallium nitride layer 103a was about 60 nm.

After the formation of the constituent layers 100a, 101, 102, 103 and 103a of the stacked layer structure 11, the temperature of the substrate 100 was immediately lowered from 1100° C. to 950° C. under addition of ammonia gas to a mixed gas stream containing argon and hydrogen at the same volume. From 1100° C. to 950° C., only the flow rate of hydrogen gas constituting the atmosphere and exhibiting a large thermal conductivity was increased from 4 liters/minute to 8 liters/minute, and the substrate was substantially force-cooled within one minute. After the temperature of the substrate 100 had been lowered to 950° C., the gas allowed to flow in the MOCVD reactor was limited to argon. The decrease of the temperature from 950° C. to 650° C. was conducted at the rate of 10° C./minute for 30 minutes. The decrease from 650° C. to room temperature was conducted using an argon-hydrogen atmosphere in the MOCVD reactor. It took about 45 minutes to lower the temperature to about 30° C.

After cooling, using a section of the stacked layer structure 11 as a sample, the internal structure of the light emitting layer 102 was observed by an ordinary cross-sectional TEM technique at an acceleration voltage of 200 KV.

Figure 3:
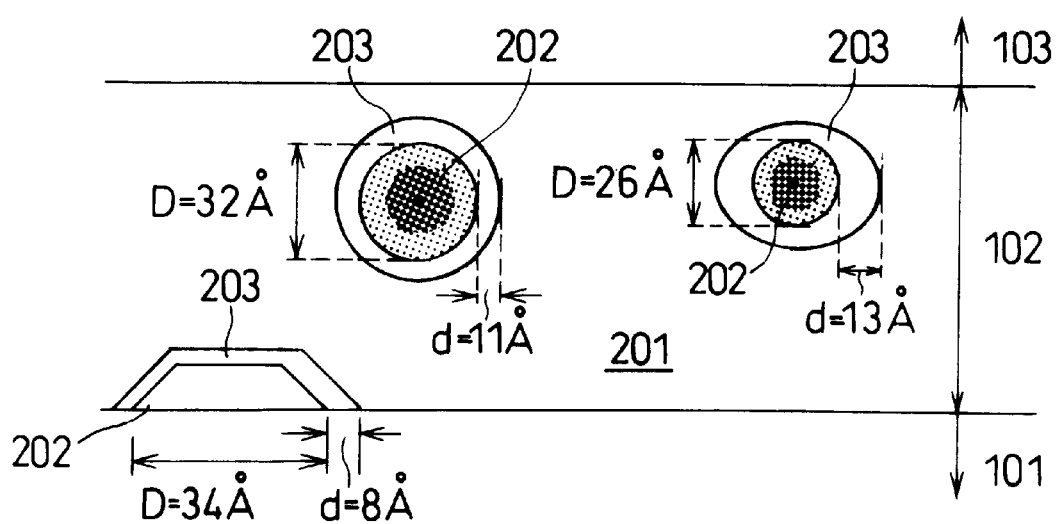
FIG. 3 is a diagram representing a crystal lattice image obtained by photographing the light emitting layer in the light-emitting device of the First Example with a transmission electron microscope (TEM).

FIG. 3 is a diagram representing crystal lattice image obtained by photographing the light emitting layer of the First Example with a transmission electron microscope (TEM). The observation magnification was $2\times10^{16}$. FIG. 3 demonstrates that the light emitting layer 102 in the First Example was composed of a multi-phase structure comprising a main phase 201 and approximately spherical- or island-shaped sub-phases 202. The island-shaped sub-phases 202 were more prominently observed near the interface between the light emitting layer 102 and the n-type gallium nitride layer 101 than in other regions. The density of the sub-phases 202 calculated from the number of the sub-phases 202 within the photographed region was about $2\times10^{17}$ $cm^{-3}$. The indium contents of the main phase 201 and the sub-phases 202 were different, and the indium concentration of the sub-phases 202 was observed to have a stronger tendency to increase in indium concentration than the main phase 201. Sub-phases having an indium content of about 30% were also observed.

It was observed that the sub-phases 202 each had a strained layer 203 at the boundary with the main phase 201. The diameter of the approximately spherical sub-phases 202 was about 25 to 35 Å(2.5 to 3.5 nm). The width of the island-shaped sub-phases 202 was about 35 Å. In some cases, the difference in the angle of the direction of orientation of the lattice plane in the sub-phase 202 and the strained layer 203 was about 60 degrees. Though the strained layer 203 was not always present around the sub-phase 202 at a uniform thickness, the average thickness thereof was about 10 Å. The thickness (width) d of the strained layer 203 surrounding the sub-phase 202 having a diameter or width of 25 to 35 Å was 8 to 13 Å. The thickness d of the strained layer 203 surrounding the sub-phase 202 is of comparatively small diameter or width (about 10 to 15 Å) ranged from a little less than 5 Å to about 7 Å. Moreover, the percentage of the sub-phases having the strained layer of such thicknesses was about 86%.

An LED was manufactured using the foregoing stacked layer structure 11 as stock.

Figure 4:
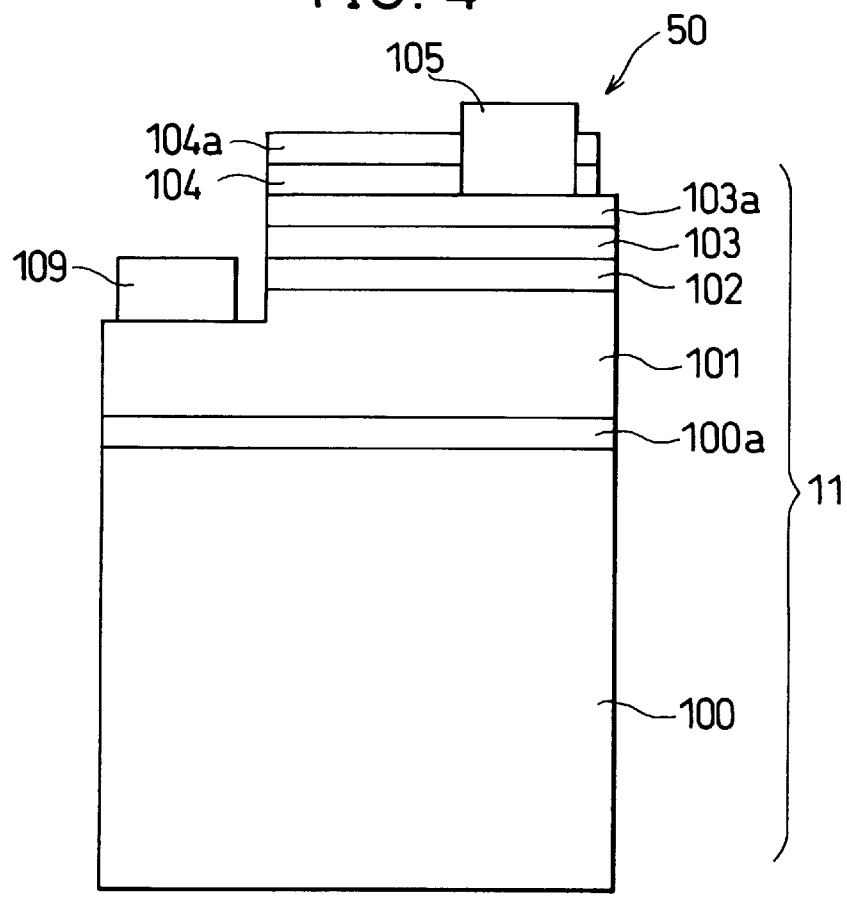
FIG. 4 is a sectional view taken along line 4—4 in FIG. 5.
Figure 5:
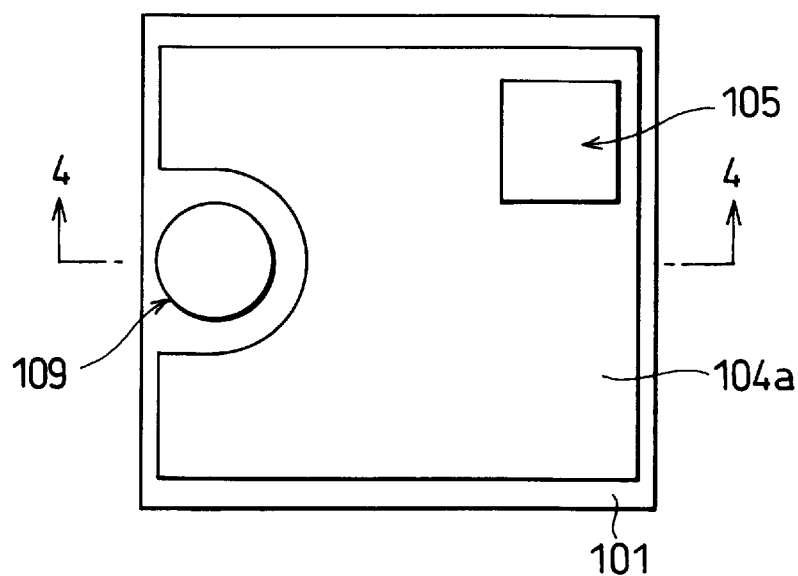
FIG. 5 is a plan view of the light-emitting device of the First Example.

FIG. 4 schematically shows the sectional structure of the LED in the First Example. The section taken along the line 4—4 in FIG. 5. FIG. 5 is a plan schematic view of the LED. The LED 50 was obtained by providing the foregoing stacked layer structure 11 with electrodes.

First, a region for forming an n-type pad electrode 109 was formed by plasma etching using methane/argon/hydrogen mixed gas. The n-type pad electrode 109 was formed to a diameter of 100 μm of elemental aluminum (Al) on a surface portion of the n-type gallium nitride layer 101 exposed by etching, by an ordinary vacuum evaporization method. The thickness of the electrode 109 was made about 2 μm. On the Mg-doped gallium nitride layer 103a, the upper most surface layer of the portion left in the form of the mesa structure, a p-type pad electrode 105 was formed by an ordinary vacuum evaporation method. The side of the electrode 105 contacting the Mg-doped gallium nitride layer 103a was formed of gold beryllium (Au Be) alloy and the upper side portion of the electrode 105 was formed of elemental gold (Au). The total thickness of the electrode 105 was made about 2 μm. The p-type pad electrode 105 was provided on the upper surface of the LED at the corner portion of the side opposite the side on which the n-type pad electrode 109 is provided. A transparent gold thin film electrode 104 having a thickness of about 20 nm was provided on the surface of the Mg-doped gallium nitride layer 103a so as to electrically contact the p-type pad electrode 105. Moreover, a transparent and insulative nickel (Ni) oxide thin film 104a having a thickness of about 10 nm was formed only on the surface of the gold thin film electrode 104. The thin film 104a serves as a protection film for substantially the whole of the exposed surface of the gold thin film electrode 104 and the Mg-doped gallium nitride layer 103a.

The LED 50 constituted as described above was operated to emit light by applying a DC voltage between the n-type pad electrode 109 and the p-type pad electrode 105. The measured emission characteristics are shown in Table 1 set out below.

Second Example

After the foregoing stacked layer structure 11 of the First Example was formed, the structure was cooled under partially different cooling conditions from those of the First Example. Specifically, after the cooling from 1100° C. to 950° C. was conducted under the same conditions as those of the First Example, the temperature was lowered from 950° C. to 800° C. at the rate of 7.5° C./minute for 20 minutes. Thereafter, the temperature was maintained at 800° C. for 15 minutes. Then, the temperature was lowered from 800° C. to 650° C. at a rate of 10° C./minute. After the temperature reached 650° C., the atmosphere gas supplied to the MOCVD reactor was limited to hydrogen, and the temperature was lowered to room temperature. It took about 45 minutes to cool to about 30° C.

After cooling, the internal structure of the light emitting layer was determined by a cross-sectional TEM technique. The light emitting layer in the Second Example assumed a multi-phase structure composed of a main phase and sub-phases, similar to the light emitting layer 102 of the First Example. The sub-phases were observed to have a strained layer at the boundary with the main phase. The indium concentration of the sub-phases are generally higher than that of the main phase, and the indium content of the main phase was estimated to be about 0.15. The sub-phases were mainly approximately spherical bodies of a uniform diameter of about 30 Å. In addition, the thickness of the strained layers around the sub-phases were uniformly about 10 Å. As mentioned above, in this Second Example, the temperature was lowered by a method including a holding time of 15 minutes at 800° C., whereby the shape of the sub-phases could be uniformized to be approximately spherical and the thickness of the strained layers could be controlled to be more uniformized. Moreover, the percentage of the sub-phases having the strained layer, which was ascertained from the cross-sectional TEM image, was about 72%.

Comparison Example

After the formation of the stacked layer structure described in the First Example, the temperature was spontaneously lowered from 1100° C. to room temperature. It took about 90 minutes for the temperature to fall to about 30° C. Therefore, the average cooling rate was about 12° C./minute. Following the background art (see Japanese Patent Public Disclosure No. 9-40490), the inert gas atmosphere was argon in the temperature below 1000° C. Unlike in the First and Second Examples, no operation of using an atmosphere gas of only hydrogen was conducted in the temperature range below 650° C.

The internal structure of the light emitting layer of the stacked layer structure cooled under the foregoing conventional conditions was observed by a cross-sectional TEM technique. Although linear black contrasts considered to be mainly attributed to dislocations were observed, spherical- or island-shaped contrasts indicative of sub-phases mainly due to aggregation of indium were not clearly observed. The density of the sub-phases was found to be $1\times10^{12}$ cm$^{-3}$ or less from the number of approximately spherical- or island-shaped contrasts located in the photographed range. Specifically, the light emitting layer could not be clearly recognize to be constituted of a multi-phase structure.

Stacked layer structures cooled under the conditions of the Second Example and the Comparison Example were processed in the manner of the First Example to fabricate LEDs. Each LED was operated to emit light by applying a DC voltage between its electrodes. The measured emission characteristics are shown in Table 1.

TABLE 1

| Characteristics | Unit | First Example | Second Example | Comparison Example |
|---|---|---|---|---|
| Emission Wavelength | nm | 448 | 450 | 431 |
| Emission Intensity | mW | 1.8 | 2.1 | 0.4 |
| Half Width | nm | 9 | 7 | 18 |
| Forward Voltage | V | 3.9 | 3.8 | 3.9 |
| Reverse Voltage | V | >40 | >40 | >40 |

From a comparison of the emission characteristics of the LEDs of the First and Second Examples and the Comparison Example shown in Table 1, it is seen that there was no substantial difference between the emission wavelengths and the emission wavelengths were in the range of 430 to 450 nm. In addition, no significant difference was observed either in the forward voltages when the forward current was set to 20 mA or in the reverse voltages when the reverse current was set to 5 μA. On the other hand, from the emission intensities, which were measured in the usual way using an ordinary integrating sphere, it will be noted that the LED of the Second Example comprising the light emitting layer including the sub-phases with substantially uniform strained layers showed the highest value of 2.1 mW. The emission intensity of the LED of the Comparison Example was the lowest at 0.4 mW. The half width of the main emission spectrum (FWHM) were significantly differents. The LED of the Second Example had the smallest half width value, at 7 nm. The half width of the LED of the First Example was 9 nm, and the half width of the LED of the Comparison Example was 18 nm, which was the largest. The LED of the Comparison Example exhibited light emission lacking monochromaticity.

Although each of the foregoing examples describes the present invention as applied to a light emitting diode (LED), the present invention can be similarly be applied to other light emitting devices such as a laser diode (LD).

Although preferred embodiments and examples of the present invention have been described in detail, it should be understood that various changes, substitutions and alterations can be made therein without departing from spirit and scope of the inventions as defined by the appended claims.

What is claimed is:

1. A nitride semiconductor light-emitting device which uses as a light emitting layer an indium-containing group-III nitride semiconductor layer of a multi-phase structure composed of a main phase and sub-phases having different indium contents, wherein said sub-phases are mainly formed of crystal whose boundary with the main phase is surrounded by a strained layer.

2. The nitride semiconductor light-emitting device according to claim 1, wherein said sub-phases are mainly formed of crystal having a strained layer of a width equal to 0.5×D or less relative to a total size D of the sub-phase.

3. The nitride semiconductor light-emitting device according to claim 1, wherein a thickness of said strained layer is in a range of from 5 Å or more to 10 nm or less.

4. The nitride semiconductor light-emitting device according to claim 1, wherein the number of the sub-phases having said strained layer accounts for 50% or more of the total number of the sub-phases.

5. The nitride semiconductor light-emitting device according to claim 1, wherein a density of said sub-phases is $2 \times 10^{18}$ cm$^{-3}$ or less.

6. The nitride semiconductor light-emitting device according to claim 1, wherein a thickness of said light emitting layer is in a range from 1 nm to 300 nm.

7. The nitride semiconductor light-emitting device according to claim 2, wherein the number of the sub-phases having said strained layer accounts for 50% or more of the total number of the sub-phases.

8. The nitride semiconductor light-emitting device according to claim 3, wherein the number of the sub-phases having said strained layer accounts for 50% or more of the total number of the sub-phases.

9. The nitride semiconductor light-emitting device according to claim 2, wherein a density of said sub-phases is $2 \times 10^{18}$ cm$^{-3}$ or less.

10. The nitride semiconductor light-emitting device according to claim 3, wherein a density of said sub-phases is $2 \times 10^{18}$ cm$^{-3}$ or less.

11. The nitride semiconductor light-emitting device according to claim 2, wherein a thickness of said light emitting layer is in a range from 1 nm to 300 nm.

12. The nitride semiconductor light-emitting device according to claim 3, wherein a thickness of said light emitting layer is in a range from 1 nm to 300 nm.

* * * * *